(12) United States Patent
Stellman et al.

(10) Patent No.: US 10,359,818 B2
(45) Date of Patent: Jul. 23, 2019

(54) DEVICE FARADAY CAGE

(71) Applicant: Microsoft Technology Licensing, LLC, Redmond, WA (US)

(72) Inventors: Taylor Stellman, San Francisco, CA (US); Bert B. Buxton, Issaquah, WA (US); Nathan M. Thome, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 207 days.

(21) Appl. No.: 14/828,400

(22) Filed: Aug. 17, 2015

(65) Prior Publication Data

US 2017/0052575 A1  Feb. 23, 2017

(51) Int. Cl.
| | |
|---|---|
| H05K 7/20 | (2006.01) |
| H05K 9/00 | (2006.01) |
| G06F 1/20 | (2006.01) |
| G06F 1/16 | (2006.01) |
| H01L 23/40 | (2006.01) |
| H01L 23/552 | (2006.01) |
| H01L 23/66 | (2006.01) |

(52) U.S. Cl.
CPC ............ *G06F 1/203* (2013.01); *G06F 1/1626* (2013.01); *G06F 1/1656* (2013.01); *G06F 1/1658* (2013.01); *H01L 23/4093* (2013.01); *H01L 23/552* (2013.01); *H01L 23/66* (2013.01); *H05K 7/20409* (2013.01); *H05K 7/20436* (2013.01); *H05K 9/0035* (2013.01); *G06F 2200/201* (2013.01)

(58) Field of Classification Search
CPC .. G06F 1/203; G06F 1/1656; G06F 2200/201; G06F 1/1658; G06F 1/1626; H05K 9/0035; H05K 7/20436; H05K 7/20409; H01L 23/552; H01L 23/4093; H01L 23/66
USPC ....... 361/688–723, 728, 760, 767, 777, 778, 361/783
See application file for complete search history.

(56) References Cited

U.S. PATENT DOCUMENTS

| | | | | |
|---|---|---|---|---|
| 5,241,453 | A | * | 8/1993 | Bright ................. H01L 23/4093 174/351 |
| 6,205,026 | B1 | * | 3/2001 | Wong ................. H01L 23/4093 165/80.3 |
| 6,490,160 | B2 | | 12/2002 | Dibene, II et al. |
| 6,496,374 | B1 | * | 12/2002 | Caldwell ................. H01L 23/32 165/185 |
| 6,853,068 | B1 | | 2/2005 | Djekic |

(Continued)

OTHER PUBLICATIONS

Nguyen, et al., "Use of Heat Pipe/Heat Sink for Thermal Management of High Performance CPUS", In Proceedings of Sixteenth Annual IEEE Semiconductor Thermal Measurement and Management Symposium, Mar. 21, 2000, pp. 76-79.

(Continued)

*Primary Examiner* — Anthony M Haughton
*Assistant Examiner* — Yahya Ahmad
(74) *Attorney, Agent, or Firm* — Rainier Patents, P.S.

(57) ABSTRACT

The description relates to devices, such as computing devices. One example can include a shielded and cooled circuit board assembly including a biasing sub-assembly that can bias a heat generating component and a thermal module together. The biasing sub-assembly can also define a portion of a Faraday cage around the heat generating component.

22 Claims, 12 Drawing Sheets

(56) References Cited

U.S. PATENT DOCUMENTS

| | | |
|---|---|---|
| 7,254,034 B2 | 8/2007 | Bolle et al. |
| 7,264,041 B2 | 9/2007 | Karidis et al. |
| 7,327,577 B2 | 2/2008 | Gilliland et al. |
| 7,447,029 B2 | 11/2008 | Lai et al. |
| 7,463,496 B2 * | 12/2008 | Robinson .............. H01L 23/552 361/816 |
| 7,589,968 B1 * | 9/2009 | Oliver ................... H05K 9/003 165/185 |
| 7,599,185 B2 | 10/2009 | Meyer, IV et al. |
| 8,462,508 B2 | 6/2013 | Lankston, II et al. |
| 8,913,384 B2 | 12/2014 | David et al. |
| 2002/0051341 A1 | 5/2002 | Frutschy et al. |
| 2003/0161588 A1 * | 8/2003 | Wolf .................... G02B 6/4246 385/88 |
| 2004/0052064 A1 * | 3/2004 | Oliver ................. H01L 23/4093 361/816 |
| 2007/0097653 A1 * | 5/2007 | Gilliland .............. H01L 23/552 361/719 |
| 2008/0137306 A1 * | 6/2008 | Kim ..................... H05K 9/0058 361/709 |
| 2008/0144303 A1 * | 6/2008 | Ice ....................... G02B 6/4292 361/818 |
| 2011/0044019 A1 * | 2/2011 | Hankui ................ H05K 9/0032 361/818 |
| 2011/0255247 A1 * | 10/2011 | Chu .................... H01L 23/4093 361/709 |
| 2012/0044636 A1 * | 2/2012 | Rothkopf ............. G06F 1/1626 361/679.55 |
| 2012/0211211 A1 | 8/2012 | Shih |
| 2013/0003292 A1 | 1/2013 | Degner et al. |
| 2013/0027870 A1 | 1/2013 | Goldr an et al. |
| 2013/0032324 A1 | 2/2013 | Aldridge et al. |
| 2013/0328741 A1 * | 12/2013 | Degner ................. G06F 1/1658 343/841 |
| 2014/0268572 A1 | 9/2014 | Ranjan et al. |
| 2016/0044816 A1 * | 2/2016 | Jarvis ................... H01R 43/205 361/759 |

OTHER PUBLICATIONS

International Search Report and Written Opinion mailed Dec. 20, 2016 from PCT Patent Application No. PCT/US2016/042704, 10 pages.

Response and Demand filed Jan. 23, 2017 from PCT Patent Application No. PCT/US2016/042704, 22 pages.

Second Written Opinion dated Jul. 31, 2017 from PCT Patent Application No. PCT/US2016/042704, 5 pages.

"International Preliminary Report on Patentability Issued in PCT Application No. PCT/US2016/042704", dated Nov. 28, 2017, 7 Pages.

* cited by examiner

INSTANCE ONE

INSTANCE TWO

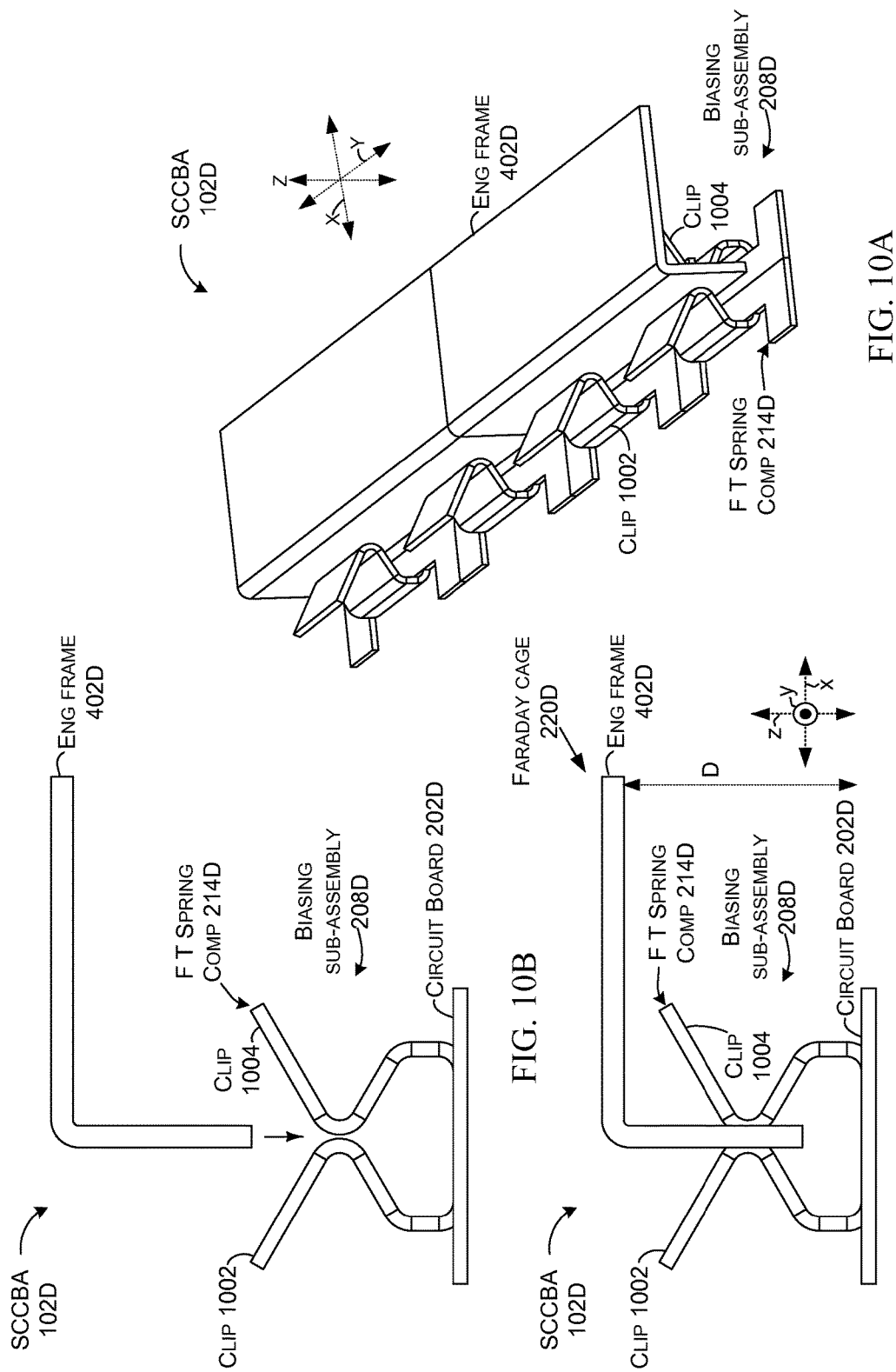

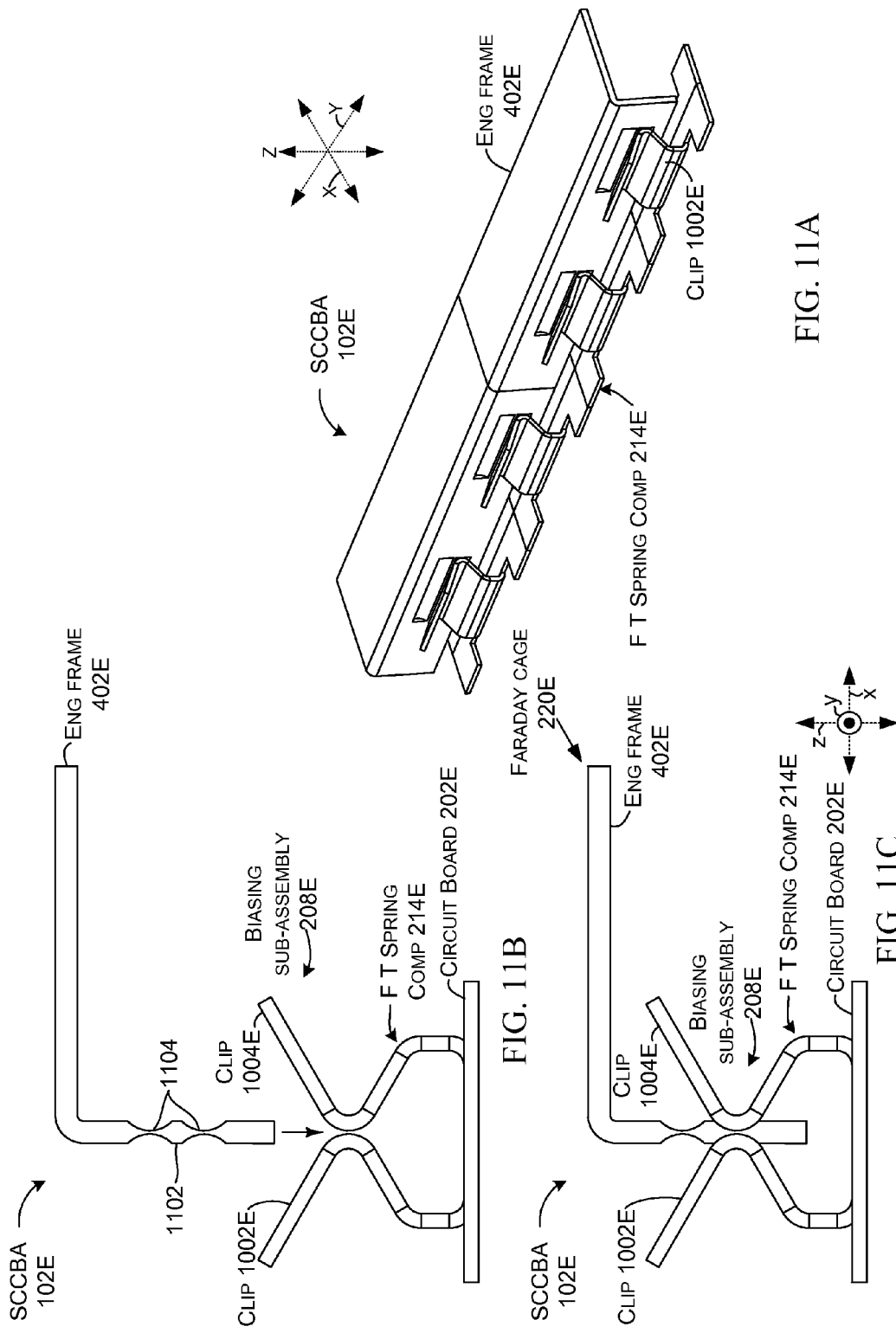

DEVICE FARADAY CAGE

BACKGROUND

The description relates to devices that have heat generating components and to cooling the heat generating components.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 4-5, 9A-9B, 10B-10C, and 11B-11C are sectional views of example components in accordance with some implementations of the present concepts.

FIGS. 6-8, 10A, and 11A are perspective views that are similar to FIG. 3 but which show other examples in accordance with the present concepts.

DESCRIPTION

The present concepts relate to devices, such as computing devices. For many form factors, such as tablets, notebooks, and/or wearable devices, consumer preferences are toward smaller form factors, especially thinner and/or lighter form factors. At the same time, consumers want high performance from computing resources, such as processing resources, memory resources, etc. The high performance tends to result in unwanted heat generation from the computing resources. This heat can be dispersed via thermal modules that can be positioned proximate to the heat generating computing resources. The heat generating computing resources are also shielded from ambient radio frequency energy that can degrade their performance. The present concepts can employ dual function components in the devices that both contribute to positioning the thermal units and the heat generating components as well as contributing to the shielding of the heat generating components. These dual function components can conserve space in thin form factor devices, among other advantages.

Figure 1:
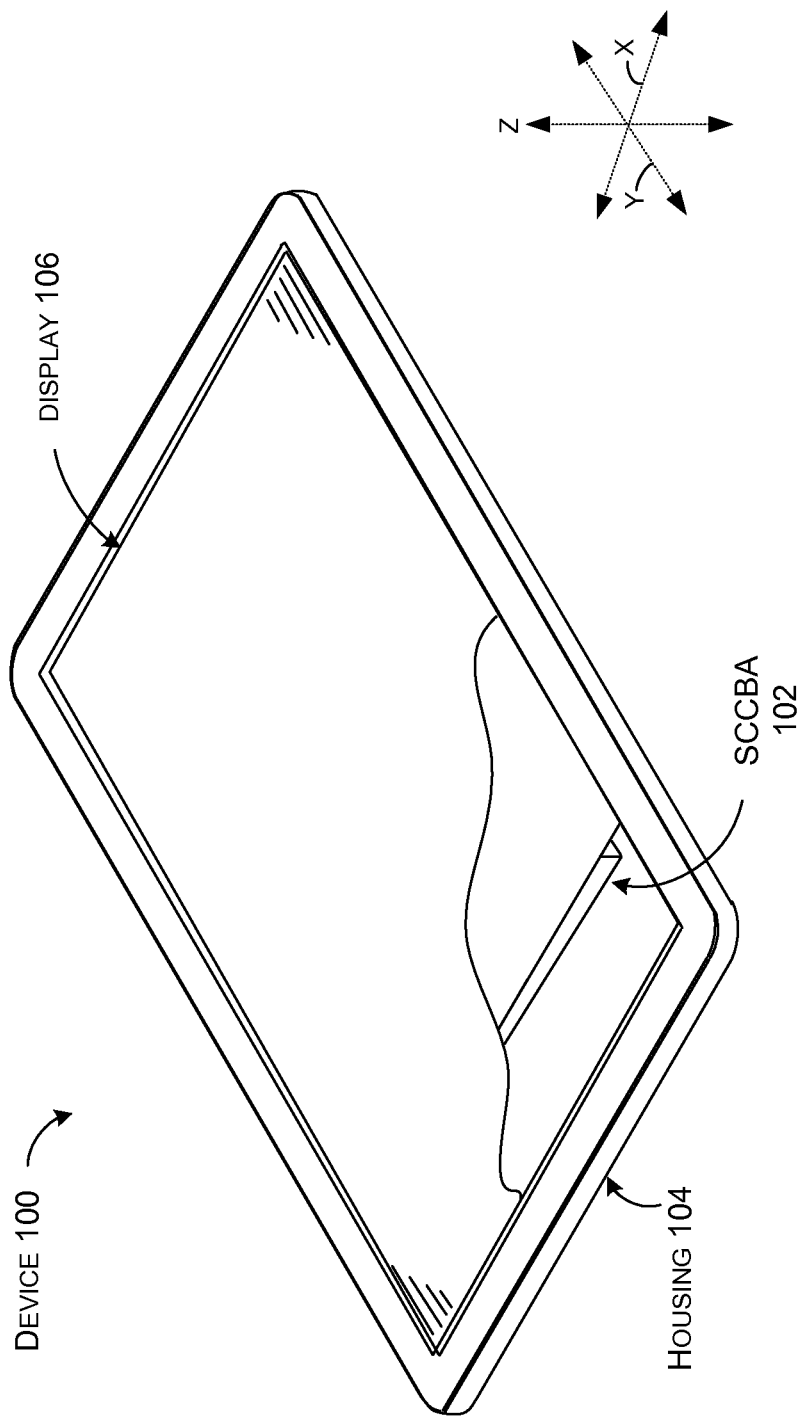
FIG. 1 is a partial cutaway perspective view of an example device that can include the present shielded and cooled heat generating component implementations in accordance with the present concepts.

FIG. 1 shows a partial cut-away view of an example device 100 manifest as a tablet type computing device. In this manifestation, device 100 can include a shielded and cooled circuit board assembly 102 (hereinafter, SCCBA) that in this example is contained within a housing 104 and a display 106.

Figure 2:
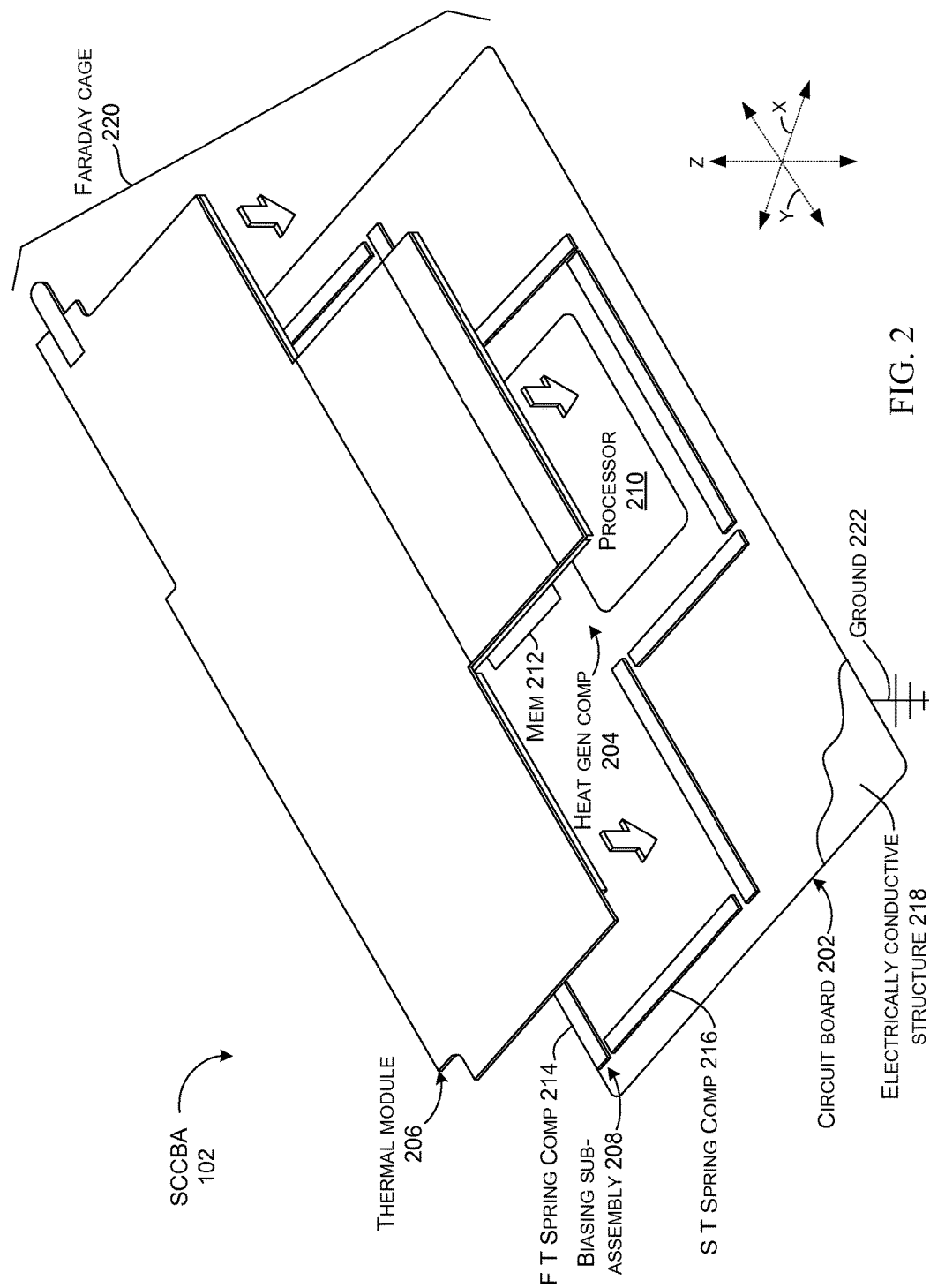
FIG. 2 is an exploded perspective view of portions of the example device of FIG. 1.

FIG. 2 is an exploded view of SCCBA 102. The SCCBA can include a circuit board 202, such as a printed circuit board (PCB) or a flexible printed circuit (FPC), a heat generating component 204 secured to the circuit board, a thermal module 206, and a biasing sub-assembly 208.

In this case, the heat generating component 204 is manifest as a processor 210, such as a central processing unit (CPU) and/or graphics processing unit (GPU) and memory 212. Alternatively or additionally, heat generating components can include various electronic circuitry, storage, and/or batteries, among others.

The thermal module 206 can be manifest as a vapor chamber, a heat pipe, a heat spreader, or a heat sink, among others.

In this implementation the biasing sub-assembly 208 can include first and second types of cooperatively operating spring components 214 and 216 respectively. Other implementations can utilize a single type of spring component or non-spring component(s). Such an example is described below relative to FIGS. 6-8. In either case, the biasing sub-assembly 208 can bias the thermal module 206 toward the heat generating component 204 (e.g., in the z reference direction) to facilitate heat transfer from the heat generating component to the thermal module for dispersal by the thermal module. For instance, the biasing sub-assembly 208 can bias the thermal module 206 toward and/or physically against the heat generating component 204. In this case, the biasing sub-assembly can also orient and/or retain the thermal module relative to a remainder of the SCCBA 102 relative to the x and y reference directions.

In this case, the circuit board 202 can include an electrically conductive structure 218. The electrically conductive structure can be positioned under the heat generating component. In this case, the electrically conductive structure 218 can be manifest as a layer of metal that is visible in a partial cutout with the overlying circuit board removed.

Note also that the electrically conductive structure 218, the thermal module 206, and the biasing sub-assembly 208 can collectively form a Faraday cage 220 around the heat generating component 204. For instance, the thermal module 206 can be in electrical contact with the biasing sub-assembly 208 which is in turn in electrical contact with the electrically conductive structure 218. These components can also be electrically connected to system ground 222 (e.g., a ground of a device in which the SCCBA 102 is installed). Faraday cage 220 can shield the heat generating component(s) from radio frequency (RF) interference. The Faraday cage can also prevent/limit heat generating components from causing RF interference to other components, such as antennas which are on the device, but outside the Faraday cage.

From one perspective, biasing sub-assembly 208 can both bias the thermal module 206 toward the heat generating component 204 and contribute to Faraday cage 220 around the heat generating component. Traditionally, a first set of components would be dedicated to forcing a thermal module against the heat generating component and a second different set of components would be dedicated to creating a Faraday cage around the heat generating component. Given the space constraints of many types of devices, having so many dedicated components has proved problematic. The present concepts solve this dilemma and offer additional advantages as discussed above and below.

Figure 3:
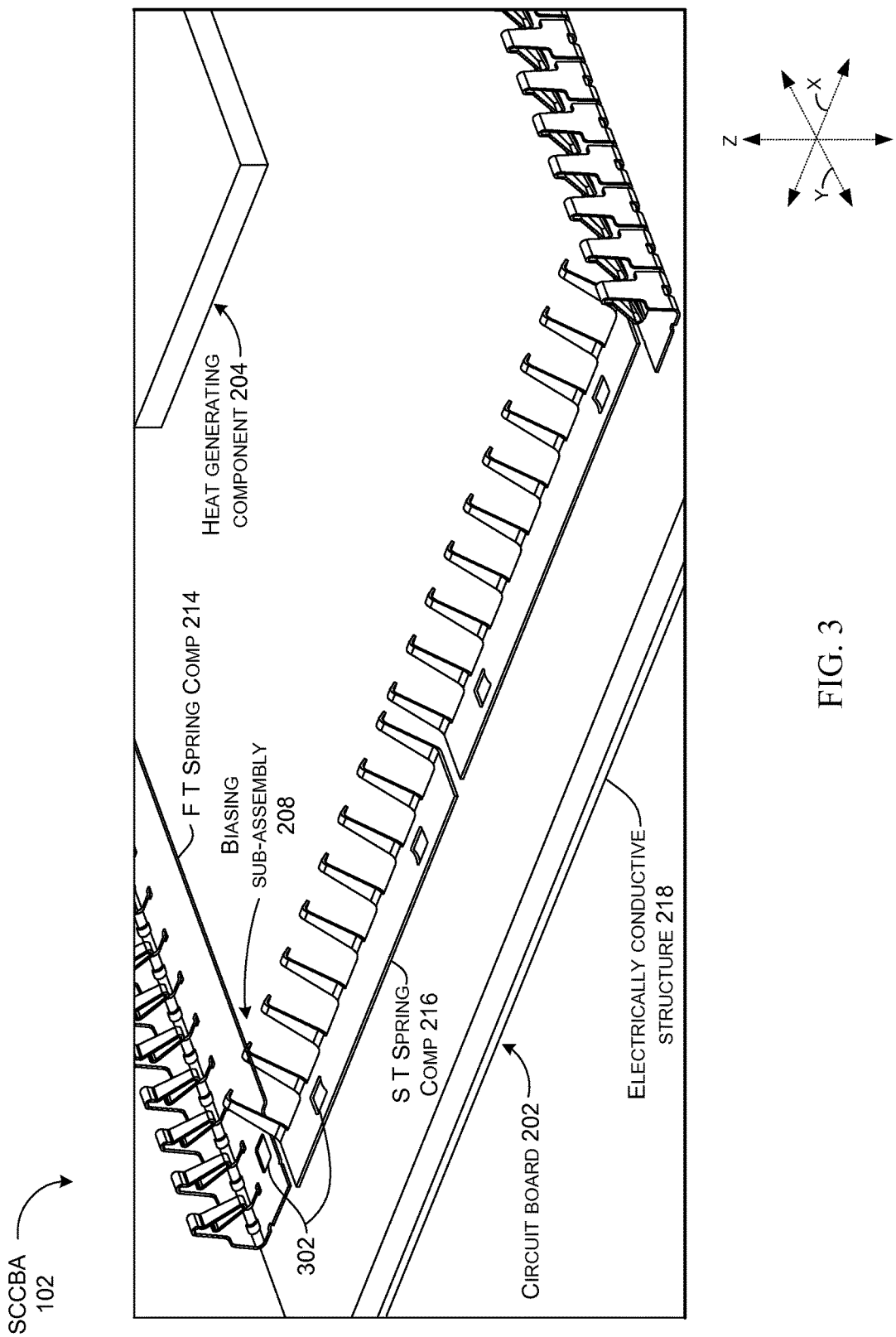
FIG. 3 is a perspective view of some of the components of the example device of FIG. 2.

FIG. 3 shows details of a portion of SCCBA 102. Specifically, FIG. 3 shows the circuit board 202 with its electrically conductive structure 218. The biasing sub-assembly 208 is also shown in more detail. For instance, first type spring component 214 and second type spring component 216 are shown secured to the circuit board 202 as indicated at 302. In some configurations, these components can be secured with metal fasteners, such as screws, rivets, and/or solder that can pass through the circuit board and contact the electrically conductive structure 218 to electrically couple the biasing sub-assembly 208 and the electrically conductive structure 218. This aspect is visible in FIG. 4.

In this case, both types of spring components 214 and 216 can be manifest as electrically conductive springs or clips. The electrically conductive springs or clips can be manufactured from various metals, such as sheet metals or non-metals, such as composites. In this example, the components operate cooperatively with one another to position the thermal module (206, FIG. 2) relative to the heat generating component 204, to allow ventilation between the thermal module and the printed circuit board 202 and to contribute to the Faraday cage (220, FIG. 2).

Figure 4:
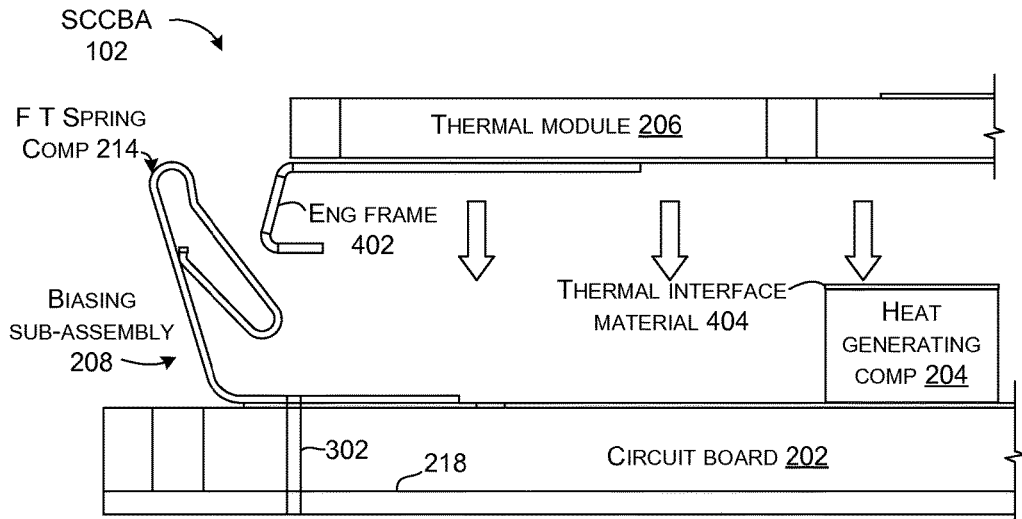
Figure 4:
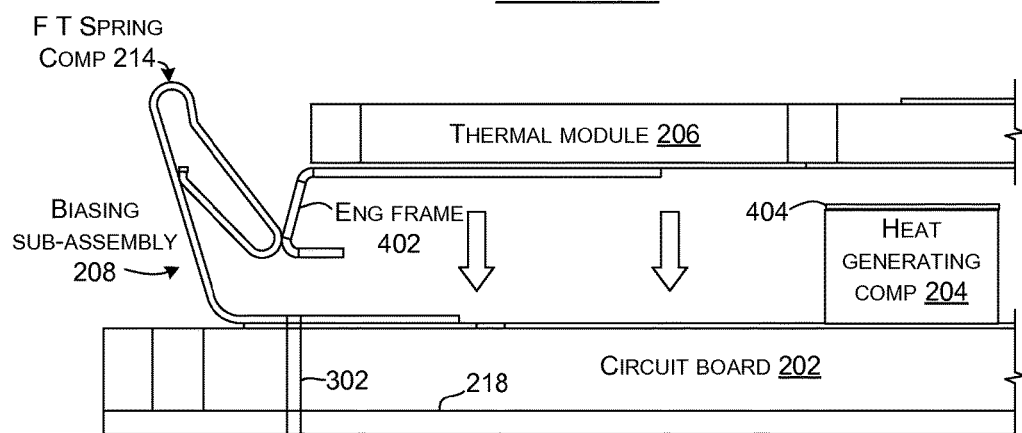
Figure 4:
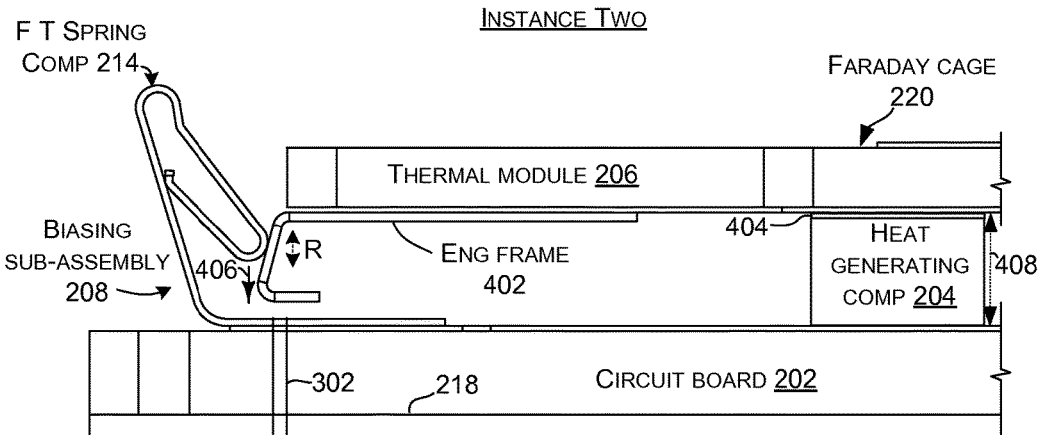

FIG. 4 shows how first type spring component 214 of the biasing sub-assembly 208 can bias the thermal module 206 toward the heat generating component 204 of the SCCBA 102. In this case, the thermal module 206 is secured to an engagement frame 402. Instance One shows the thermal module 206 positioned over (and being moved toward) the circuit board 202 with the engagement frame 402 aligned with the first type spring component 214. This could occur during assembly and could be performed by a worker or robot, for instance. Note also, that a thermal interface material (e.g., thermal paste, thermal grease, thermal compound) 404 may be spread on either or both of the heat generating component 204 and/or the thermal module 206.

Instance Two shows the engagement frame 402 engaging the first type spring component 214. Responsively, the first type spring component 214 can deflect outward (e.g., in the negative x reference direction).

Instance Three shows the engagement frame 402 engaged with the first type spring component 214. At this point, the first type spring component 214 is imparting a downward force (e.g., bias) 406 on the engagement frame which is forcing the thermal module 206 toward, and in this case, physically against the heat generating component 204. This physical contact can enhance heat energy transfer from the heat generating component 204 to the thermal module 206. This process can be further augmented by the thermal interface material 404, which is squished into a thin layer that effectively transfers heat from the heat generating component to the thermal module. Note also, that the downward force 406 can be applied through a range of heights (e.g., z dimension variation) 408. For instance, a given model of heat generating component 204, such as a given model of processor, may have some physical variability (e.g., tolerances) in the z reference direction from unit to unit and/or how the processor is secured to the circuit board 202 may produce some variability. The ability of the first type spring component 214 to generate downward force 406 through a range of heights R can accommodate these variations without any device-specific adjustments by an assembly person, machine, or robot during manufacture of the SCCBA 102. This ability results in decreased manufacturing costs and/or reduced instances of individual SCCBAs not meeting quality standards for too much or too little contact pressure between the thermal module 206 and the heat generating component 204. Note also, that this configuration can be easily and quickly disassembled by reversing the process shown in Instance One through Instance Three to lift the thermal module 206 up and away from the circuit board to expose the heat generating component 204. Upon completion of repairs/inspection, the thermal module (and/or a replacement thermal module) can be reinstalled as shown in Instance One through Three without any performance degradation.

Further, as evidenced at Instance Three, the biasing sub-assembly 208's first type spring component 214 can contribute to the Faraday cage 220 around the heat generating component 204. In the illustrated configuration, the thermal module 206 and the electrically conductive structure 218 can contribute the top and bottom, respectively, of the Faraday cage 220, and the first type spring component 214 can contribute to the sides (e.g., the xz reference plane). (Specifically, the left side is shown and the right is not shown due to space constraints on the drawing page). Thus, from one perspective, the first type spring component 214 can enhance heat transfer from the heat generating component to the thermal module by biasing the thermal module toward the heat generating component. The first type spring component 214 can simultaneously contribute to the Faraday cage 220 around the heat generating component 204.

Figure 5:
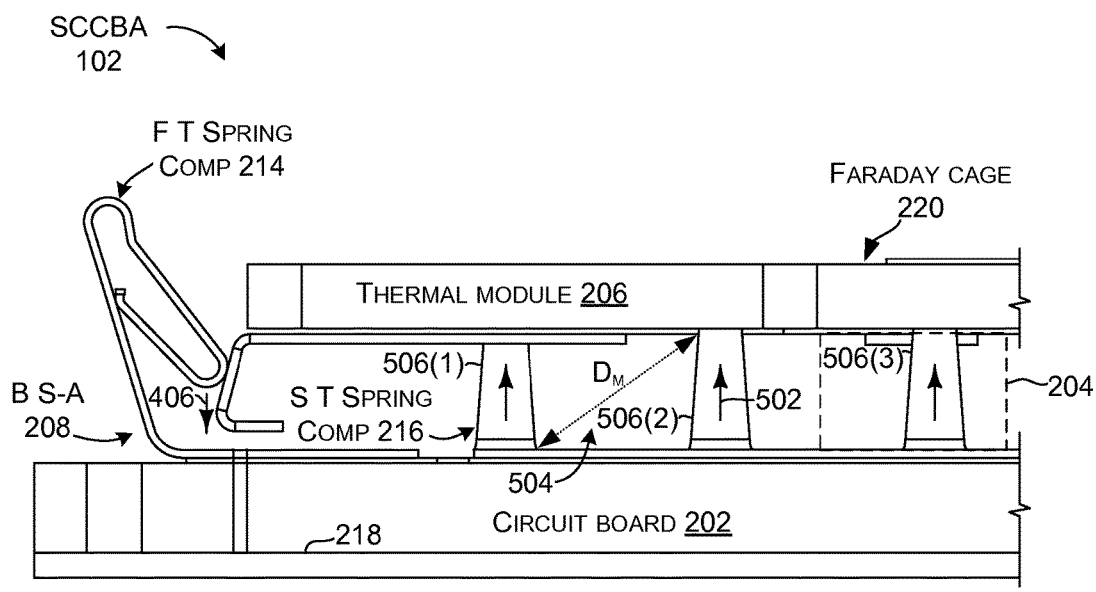

FIG. 5 shows a similar view to FIG. 4 but also shows the biasing sub-assembly 208's second type of spring component 216. In this case, the second type of spring component can create an upward force 502 that partially opposes downward force 406 imparted by the first type of spring component 214. Further, the second type of spring component 216 contributes to the Faraday cage 220. More specifically, the second type of spring component 216 contributes to the front and back portions of the Faraday cage (e.g., in the xz reference plane). In this case, the second type of spring component 216 is configured to promote airflow between the thermal module 206 and the circuit board 202 (e.g., airflow in the y reference direction). In this case, airflow is enhanced by leaving spaces or openings 504 between individual springs 506 of the second type of spring component 216. The dimensions D of the spaces can be selected based upon wavelengths of RF energy Faraday cage 220 is intended to block. For instance, in the illustrated case, a maximum dimension $D_m$ of the spaces can be about 4 millimeters or less with some implementations employing 2.5 millimeters or less.

Considered from one perspective, in some implementations thermal module 206 and electrically conductive structure 218 can be generally parallel spaced-apart planar structures or surfaces (e.g., in the xy reference plane). The biasing sub-assembly 208 can extend between the thermal module 206 and electrically conductive structure 218, such as at their perimeters to form the Faraday cage 220.

Figure 6:
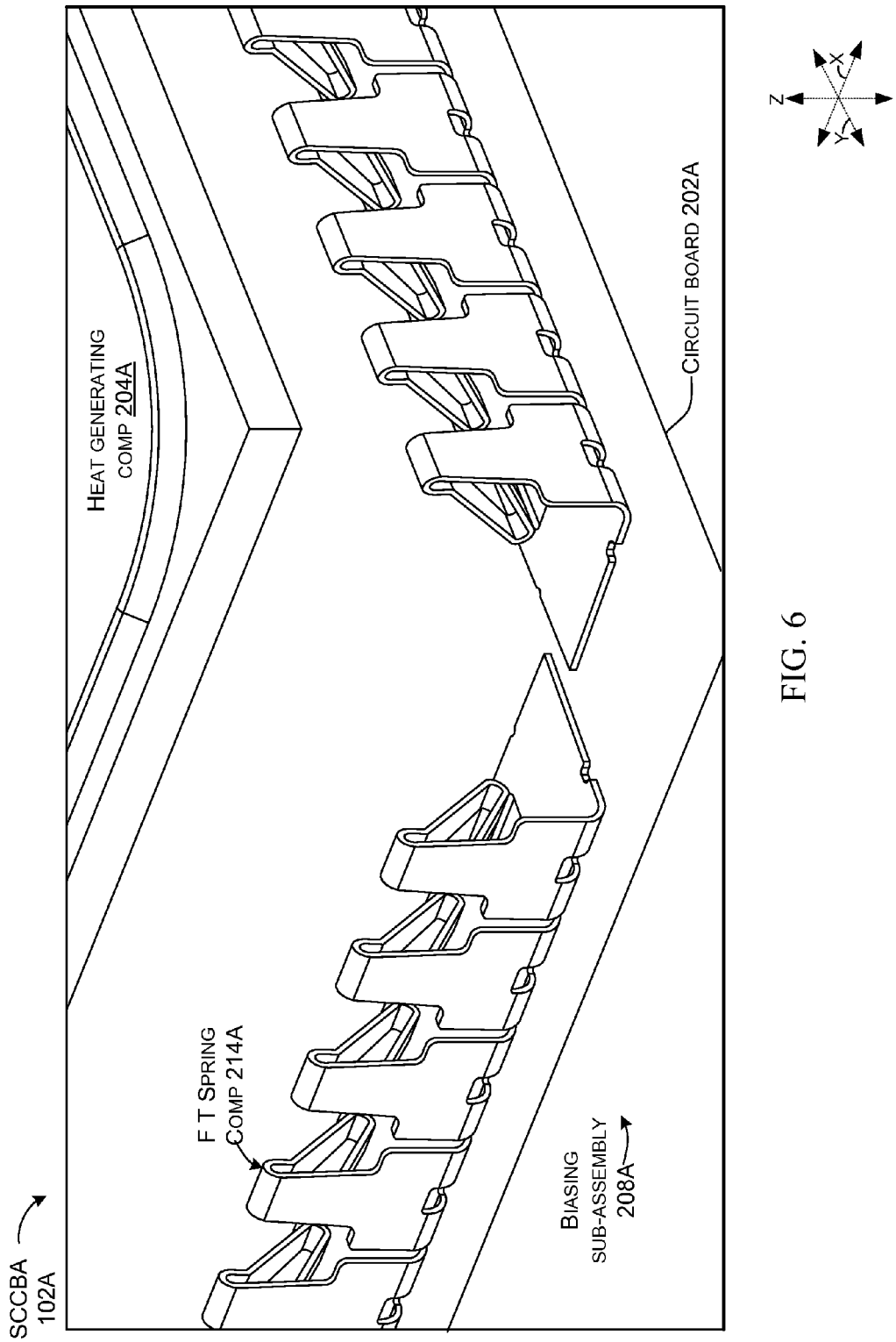
Figure 7:
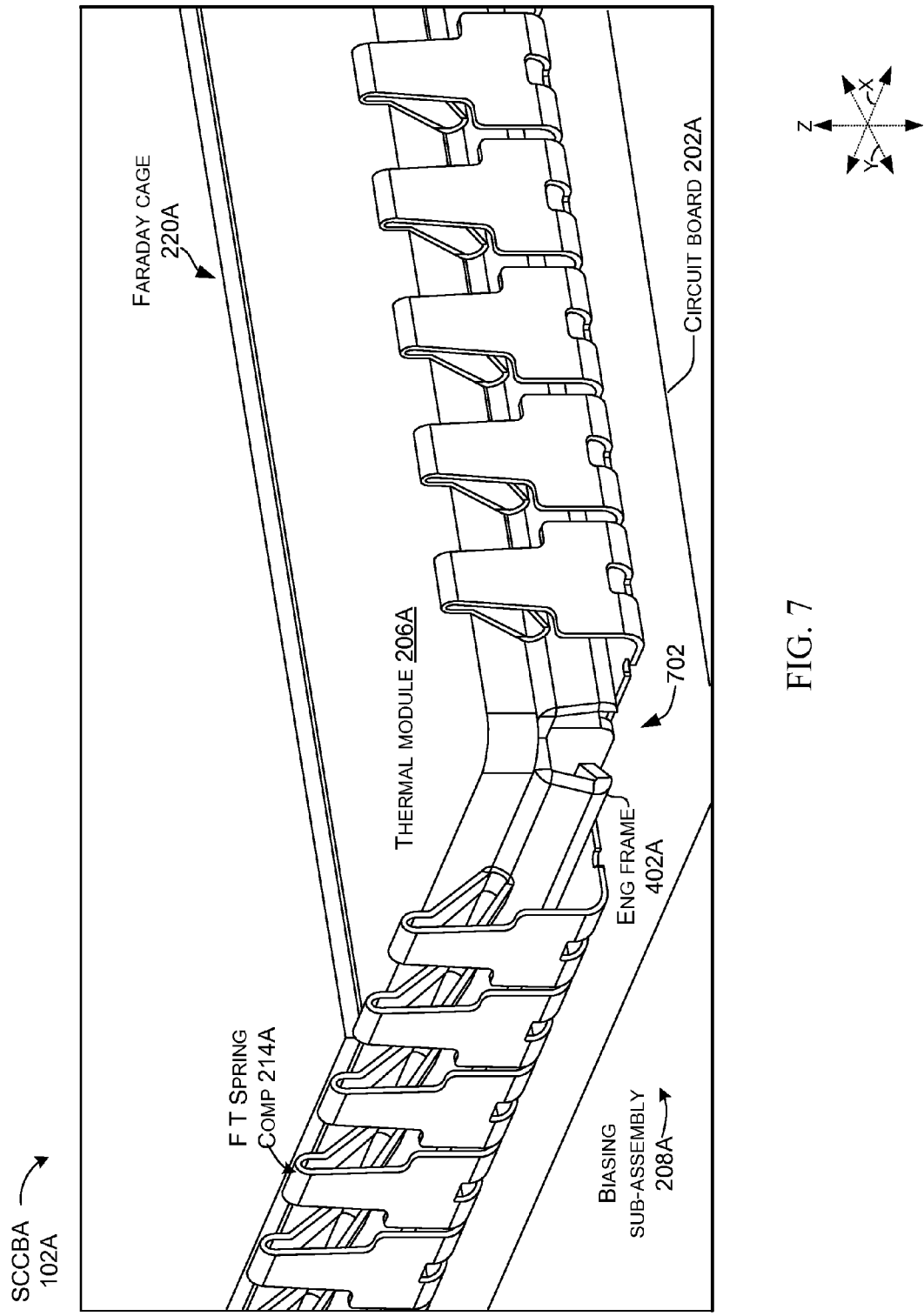

FIGS. 6-7 collectively show another example SCCBA 102A that includes biasing sub-assembly 208A. In this case, the single type spring component is employed to accomplish SCCBA 102A, rather than multiple types of spring components. In this case, the single type spring component is similar to the first type spring component 214 introduced above relative to FIG. 2 and as such is referred to as 'first spring type component 214A.' FIG. 6 shows the first spring type component 214A on circuit board 202A, and FIG. 7 shows the thermal module 206A installed relative to the first spring type component 214A and being forced downward (e.g., negative z direction) by the first spring type component 214A acting upon the thermal module's engagement frame 402A. In this implementation, the first spring type component 214A may leave a gap as indicated at 702 that may compromise the Faraday cage 220A. The gap 702 can be filled with conductive grounding foam, foil, and/or other component. An alternative configuration is shown in FIG. 8.

Figure 8:
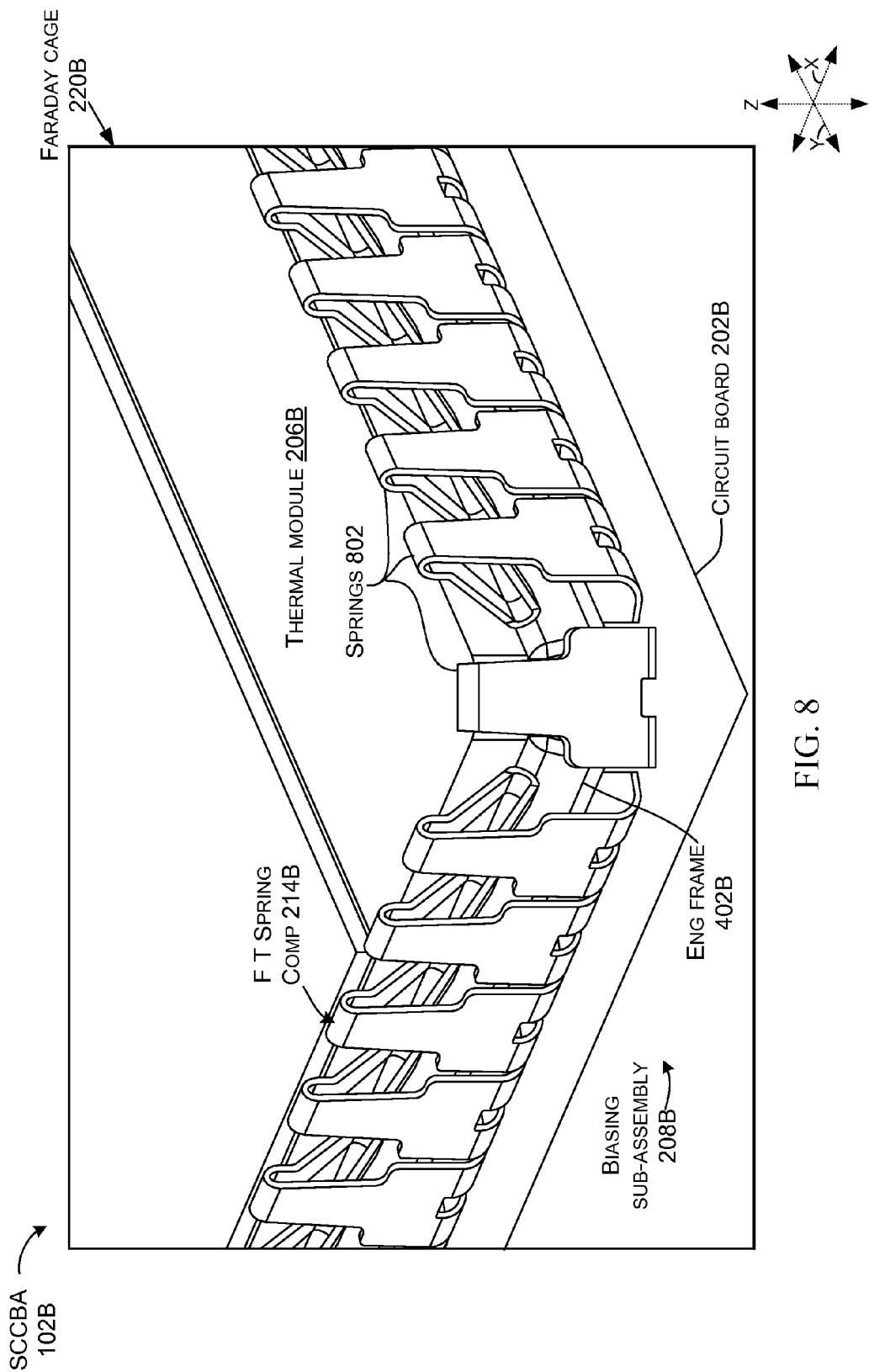

FIG. 8 shows another example SCCBA 102B that includes biasing sub-assembly 208B. In this case, the biasing sub-assembly includes a single spring type component manifest as first spring type component 214B that is contiguous along the sides of the Faraday cage 220B. Spaces between individual springs 802 (not all of which are designated with specificity) of the first spring type component 214B can promote airflow between circuit board 202B and thermal module 206B. However, as mentioned above relative to FIG. 5, the maximum dimensions of the spaces of the first spring type component 214B can be limited to ensure proper functioning of the Faraday cage 220B (e.g., to block passage of RF energy). This configuration can reduce and/or eliminate use of conductive grounding foam as mentioned above relative to FIG. 7.

Figure 9A:
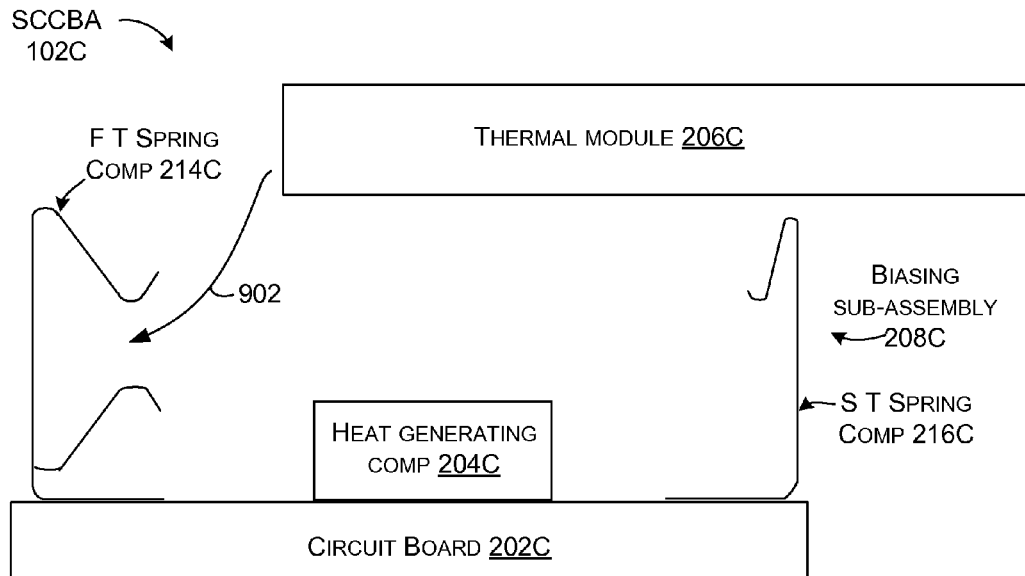
Figure 9A:
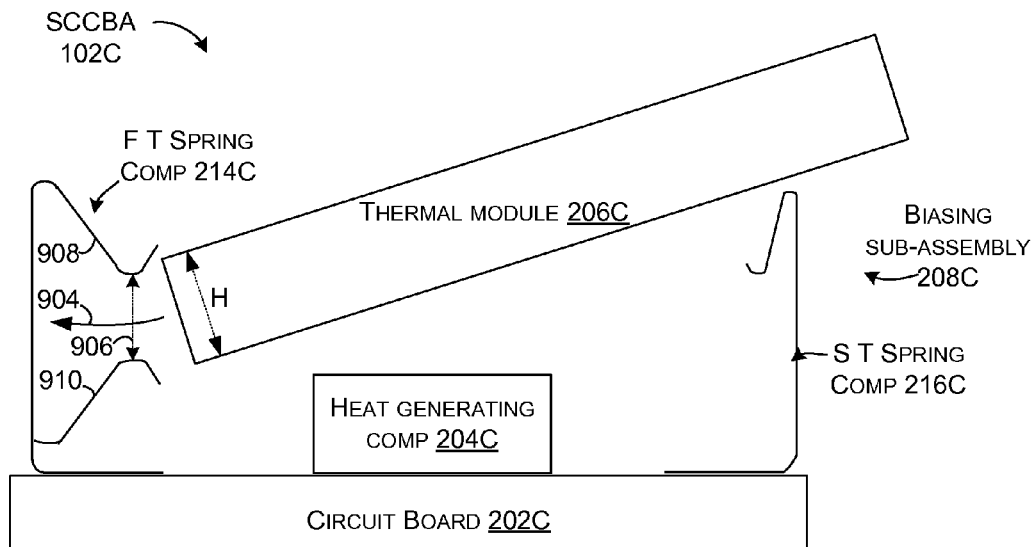
Figure 9A:
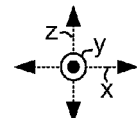
Figure 9B:
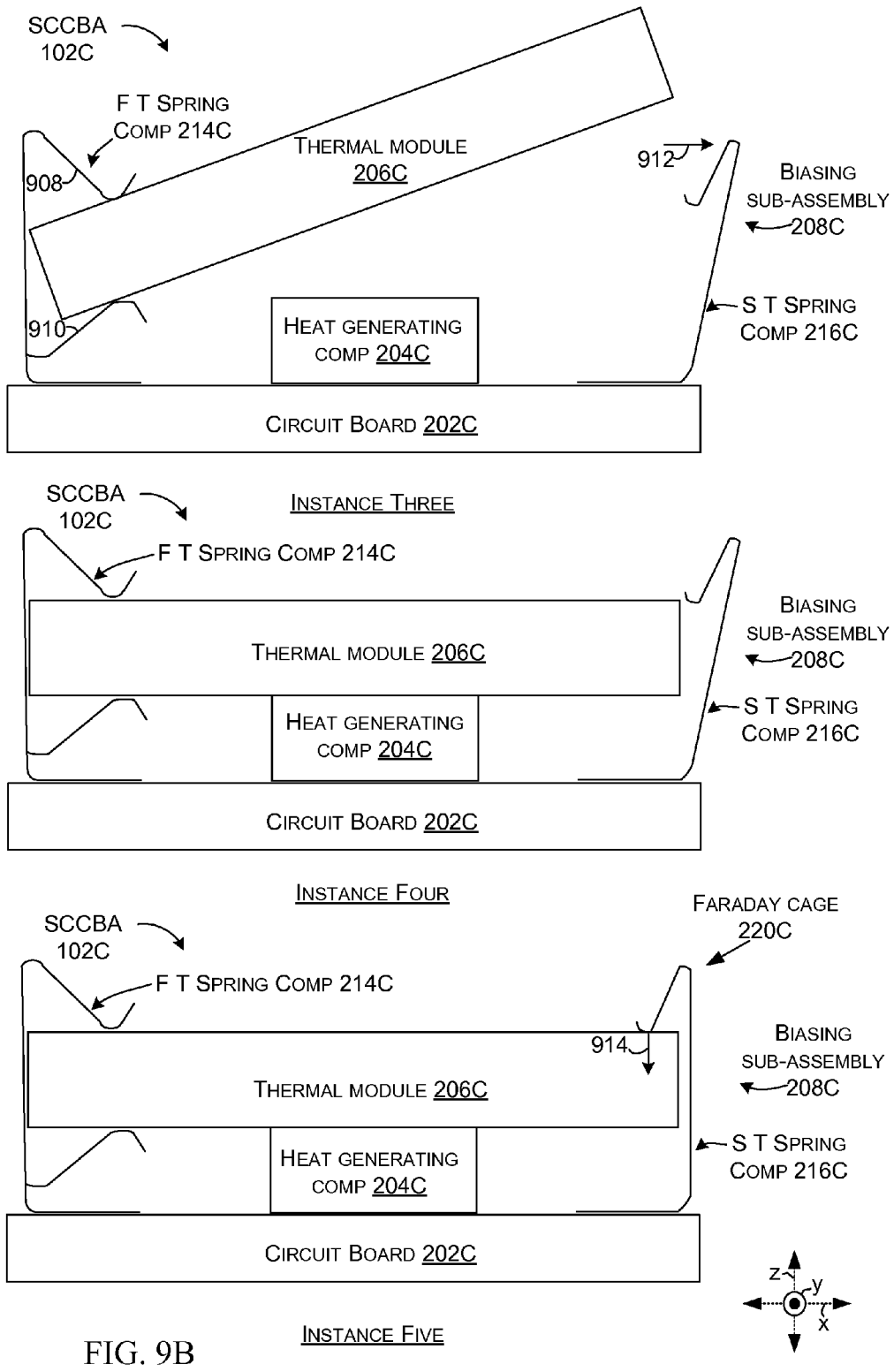

FIGS. 9A and 9B collectively show another example SCCBA 102C that includes biasing sub-assembly 208C. This biasing sub-assembly employs first and second spring type components 214C and 216C that are secured relative to circuit board 202C. Heat generating component 204C is located on the circuit board 202C between the first and second spring type components 214C and 216C. At Instance One and Instance Two, thermal module 206C can be aligned with spring type component 214C as indicated by arrows 902 and 904. Note that in this implementation, an opening 906 between upper and lower clips 908 and 910 is slightly less than a height H of the thermal module 206C.

At Instance Three, thermal module 206C can be forced into opening 906 (designated Instance Two) by slightly spreading upper and lower clips 908 and 910. Also, second spring type component 216C can be forced outward (e.g., in the positive x reference direction as indicated by arrow 912). At Instance Four, the thermal module 206C is pivoted downward until it is generally horizontal. At Instance Five, the second spring type component 216C is released and rides over the thermal module 206C to retain the thermal module and create downward pressure on the thermal module toward (and against) the heat generating component as indicated by arrow 914.

Downward force 914 can also be generated by the first type spring component 214C. The downward force 914 can be determined by the balance of generally opposing forces generated by first and second clips 908 and 910. For instance, downward force can be increased by making first spring 908 wider in the y reference direction than spring 910. The assembly process shown in FIGS. 9A and 9B can be reversed to remove the thermal module. Note that in this implementation, the first and second spring type components 214C and 216C directly contact the thermal module 206C and thus no engagement frame (see 402, FIG. 4) is employed. Further, at Instance Five the first and second spring type components 214C and 216C contribute to Faraday cage 220C around the heat generating component 204C. Note that there can be other heat generating components and/or non-heat generating components in the Faraday cage 220C besides the illustrated heat generating component 204C.

Viewed from one perspective, the second type spring component 216C can be resiliently biased over the thermal module 206C to create a downward force on the thermal module. Thus, the second type spring component 216C is resiliently biased for lateral movement relative to the z direction. This resilient bias can be overcome by pulling the second type spring component in the x direction to insert the thermal module 206C (e.g., Instance Three). Once the thermal module is inserted and the second type spring component is released (e.g., Instance Four), it is resiliently biased to snap back over the thermal module to resiliently bias the thermal module downward in the negative z reference direction (e.g., Instance Five). Similarly, first type spring component 214C includes two clips 908 and 910 that are resiliently biased toward one another and can hold the thermal module when it is inserted between them to partially overcome this resilient bias. The first type spring component can also be configured to provide a net downward force on the thermal module or can be neutral in the z direction and allow the downward force to be imparted by the second type spring component.

FIGS. 10A-10C collectively show close-up views of biasing sub-assembly 208D of SCCBA 102D. The biasing sub-assembly is secured to circuit board 202D. Recall that while not shown in this view, the heat generating component can also be secured to the circuit board. In this case, the first type spring component 214D is manifest as two generally opposing clips 1002 and 1004 that are biased toward one another. As illustrated in FIGS. 10B and 10C, engagement frame 402D can be forced downward between the opposing clips 1002 and 1004. Recall that while not shown, the engagement frame can be secured to the thermal module. Friction between the clips 1002 and 1004 and engagement frame 402D can maintain a downward force on the engagement frame toward the circuit board 202D (and thereby force the thermal module toward the heat generating component). Note further that this configuration can adapt to tolerances in SCCBA components in the z direction while maintaining the downward force (e.g., the force imparted on the engagement frame 402D toward the circuit board 202D is not dependent upon an exact distance D between the engagement frame and the circuit board). Further, while contributing the downward pressure, the biasing sub-assembly 208D contributes to the Faraday cage 220D.

FIGS. 11A-11C show a variation of SCCBA 102E that is similar to the SCCBA of FIGS. 10A-10C. In this case, the engagement frame 402E can have a series of alternating wide and narrow portions 1102 and 1104 that are engaged by opposing clips 1002E and 1004E of the biasing sub-assembly 208E. This configuration can offer the vertical adjustability discussed above relative to FIGS. 10A-10C as well as potentially increased holding interaction between the engagement frame and the biasing sub-assembly that can result in potentially increased downward force (e.g., forcing the circuit board and its heat generating component (not shown) and the engagement frame and its thermal module (not shown) toward one another). Also, the biasing sub-assembly, using the same components that contribute the downward force, contributes to Faraday cage 220E.

The present multi-function biasing structure concepts can be utilized with various types of devices, such as computing devices that can include but are not limited to notebook computers, tablet type computers, smart phones, wearable smart devices, gaming devices, entertainment consoles, and/or other developing or yet to be developed types of devices. As used herein, a computing device can be any type of device that has some amount of processing and/or storage capacity. A mobile computing device can be any computing device that is intended to be readily transported by a user.

Additional Examples

Various device examples are described above. Additional examples are described below. One example is manifest as a device comprising a circuit board. The circuit board includes a heat generating component, a thermal module positioned over the heat generating component, and an electrically conductive structure positioned under the heat generating component. The circuit board also includes a biasing sub-assembly that physically biases the thermal module toward the heat generating component and that operates cooperatively with the thermal module and the electrically conductive structure to form a Faraday cage around the heat generating component.

Another example can include any combination of the above and/or below examples where the heat generating component comprises a processor, and/or memory, and where the device includes an antenna that is positioned outside of the Faraday cage, and where the Faraday cage protects the antenna from RF energy generated by the heat generating component.

Another example can include any combination of the above and/or below examples where the thermal module comprises a vapor chamber, a heat pipe, a heat spreader, or a heat sink.

Another example can include any combination of the above and/or below examples where the biasing sub-assembly comprises a spring.

Another example can include any combination of the above and/or below examples where the biasing sub-assembly comprises a first type spring component and a second type spring component or where the biasing sub-assembly comprises a single type spring component.

Another example can include any combination of the above and/or below examples where the electrically conductive structure is incorporated into the circuit board or where the electrically conductive structure is external to the circuit board.

Another example can include any combination of the above and/or below examples where the biasing sub-assembly directly physically contacts the thermal module or where the biasing sub-assembly indirectly physically interacts with the thermal module.

Another example can include any combination of the above and/or below examples where the biasing sub-assembly directly physically contacts an engagement frame secured to the thermal module.

Another example can include any combination of the above and/or below examples where the thermal module and the electrically conductive structure form generally parallel planar surfaces of the Faraday cage and where the biasing sub-assembly forms at least a portion of the Faraday cage between the generally parallel planar surfaces.

Another example can include any combination of the above and/or below examples where the biasing sub-assembly completes the Faraday cage between the generally parallel planar surfaces.

Another example can include any combination of the above and/or below examples where the biasing sub-assembly contacts a perimeter of the thermal module.

Another example can include any combination of the above and/or below examples where the biasing sub-assembly defines openings that facilitate airflow between the thermal module and the circuit board and where a maximum dimension of the openings is less than a wavelength of radio frequency energy that the Faraday cage is configured to shield from the heat generating component.

Another example can include any combination of the above and/or below examples where the maximum dimension is about 2.5 millimeters or less.

Another example is manifest as a device comprising a processor with a Faraday cage formed around the processor. At least one portion of the Faraday cage comprises a thermal module and another portion of the Faraday cage comprises a biasing sub-assembly that biases the thermal module toward the processor.

Another example can include any combination of the above and/or below examples where the biasing sub-assembly comprises at least a first type spring component that forces the thermal module and the processor toward one another.

Another example can include any combination of the above and/or below examples where the first type spring component forces the thermal module and the processor toward one another through a range of distances.

Another example can include any combination of the above and/or below examples where the biasing sub-assembly forces the thermal module and the processor into direct physical contact with one another.

Another example can include any combination of the above and/or below examples where the Faraday cage comprises two generally parallel spaced apart surfaces and where the biasing sub-assembly extends between the two generally parallel spaced apart surfaces.

Another example is manifest as a device comprising a shielded and cooled circuit board including a biasing sub-assembly that biases a heat generating component and a thermal module together. The biasing sub-assembly further comprises a portion of a Faraday cage around the heat generating component.

Another example can include any combination of the above and/or below examples where the biasing sub-assembly is secured relative to the heat generating component and comprises a first type spring component that is resiliently biased over the thermal module to bias the heat generating component and the thermal module together.

Another example can include any combination of the above and/or below examples where the resiliently bias of the biasing sub-assembly over the thermal module can be temporarily overcome to separate the heat generating component and the thermal module.

Another example can include any combination of the above and/or below examples where the biasing sub-assembly is secured relative to the thermal module and comprises a first type spring component that is resiliently biased over the heat generating component to bias the heat generating component and the thermal module together.

CONCLUSION

Although techniques, methods, devices, systems, etc., pertaining to biasing sub-assemblies are described in language specific to structural features and/or methodological acts, it is to be understood that the subject matter defined in the appended claims is not necessarily limited to the specific features or acts described. Rather, the specific features and acts are disclosed as exemplary forms of implementing the claimed methods, devices, systems, etc.

The invention claimed is:
1. A device, comprising:
a circuit board that includes a heat generating component;
a thermal module positioned over the heat generating component;
an engagement frame, the thermal module being secured to the engagement frame;
an electrically conductive structure positioned under the heat generating component; and,
springs or clips secured to the circuit board and configured to engage the engagement frame and impact a force on the engagement frame that physically biases the thermal module toward the heat generating component, the springs or clips operating cooperatively with the thermal module and the electrically conductive structure to form a Faraday cage around the heat generating component,
wherein the thermal module and the electrically conductive structure form generally parallel planar surfaces of the Faraday cage, the springs or clips form sides of the Faraday cage between the generally parallel planar surfaces, and the springs or clips define openings that facilitate airflow between the thermal module and the circuit board.

2. The device of claim 1, wherein the heat generating component comprises a processor and/or memory.

3. The device of claim 1, wherein the thermal module comprises a vapor chamber, a heat pipe, a heat spreader, or a heat sink.

4. The device of claim 1, further comprising a thermal interface material between the heat generating component and the thermal module.

5. The device of claim 1, wherein the springs or clips comprise a first type of spring and a second type of spring.

6. The device of claim 1, wherein the electrically conductive structure is incorporated into the circuit board.

7. The device of claim 1, wherein the engagement frame is secured to a bottom portion of the thermal module.

8. The device of claim 1, wherein individual springs or individual clips are configured to deflect outward as the thermal module is moved toward the circuit board.

9. The device of claim 1, further comprising one or more other springs configured to oppose the force imparted by the springs or clips.

10. The device of claim 9, wherein a maximum dimension of the openings is less than a wavelength of radio frequency energy that the Faraday cage is configured to shield from the heat generating component.

11. A device, comprising:
a circuit board that includes a heat generating component;
a thermal module positioned over the heat generating component;
an electrically conductive structure positioned under the heat generating component; and,
a biasing sub-assembly that physically biases the thermal module toward the heat generating component and that operates cooperatively with the thermal module and the electrically conductive structure to form a Faraday cage around the heat generating component,
wherein the biasing sub-assembly defines openings that facilitate airflow between the thermal module and the circuit board and wherein a maximum dimension of the openings is less than a wavelength of radio frequency energy that the Faraday cage is configured to shield from the heat generating component.

12. The device of claim 11, wherein the maximum dimension is about 2.5 millimeters or less.

13. A device, comprising:
a circuit board having a processor; and,
a Faraday cage formed around the processor, at least one portion of the Faraday cage comprising a thermal module and another portion of the Faraday cage comprising a plurality of clips that bias the thermal module toward the processor,
the plurality of clips being secured to the circuit board and comprising upper clips and lower clips, the upper clips engaging a top portion of the thermal module and the lower clips engaging a bottom portion of the thermal module,
the plurality of clips defining openings that facilitate airflow between the thermal module and the circuit board.

14. The device of claim 13, wherein the openings are 2.5 millimeters or less.

15. The device of claim 13, further comprising a spring component configured to create a downward force biasing the thermal module toward the processor.

16. The device of claim 15, wherein the spring component forces the thermal module and the processor into direct physical contact with one another.

17. The device of claim 13, wherein a maximum dimension of the openings is less than a wavelength of radio frequency energy that the Faraday cage is configured to shield from the processor.

18. A device, comprising:
a shielded and cooled circuit board including multiple spring components that bias a heat generating component and a thermal module together,
the multiple spring components forming a side portion of a Faraday cage around the heat generating component and having openings between the multiple spring components of the side portion,
wherein a maximum dimension of the openings is less than a wavelength of radio frequency energy that the Faraday cage is configured to shield from the heat generating component.

19. The device of claim 18, wherein the multiple spring components include multiple springs that are resiliently biased over the thermal module to bias the heat generating component and the thermal module together.

20. The device of claim 19, wherein the resilient bias of the multiple springs over the thermal module can be temporarily overcome to separate the heat generating component and the thermal module.

21. The device of claim 19, wherein the heat generating component forms a generally planar surface that extends through the multiple springs and the openings.

22. The device of claim 18, wherein the thermal module comprises a vapor chamber, a heat pipe, or a heat spreader.

* * * * *